United States Patent [19]
Sugiyama et al.

[11] Patent Number: 6,106,139
[45] Date of Patent: Aug. 22, 2000

[54] ILLUMINATION OPTICAL APPARATUS AND SEMICONDUCTOR DEVICE MANUFACTURING METHOD

[75] Inventors: Kayo Sugiyama, Yokohama; Osamu Tanitsu, Chiba, both of Japan

[73] Assignee: Nikon Corporation, Tokyo, Japan

[21] Appl. No.: 09/177,138

[22] Filed: Oct. 21, 1998

[30]       Foreign Application Priority Data

Oct. 30, 1997   [JP]   Japan .................................. 9-316309

[51] Int. Cl.⁷ .................................................. G03B 27/42
[52] U.S. Cl. .......................... 362/326; 362/327; 355/53; 355/54; 355/67; 355/43
[58] Field of Search ................................... 362/326, 327; 355/53, 54, 67, 43, 45, 68, 71; 356/399, 400, 401; 359/385, 389

[56]                References Cited

U.S. PATENT DOCUMENTS

| | | | |
|---|---|---|---|
| 4,497,015 | 1/1985 | Konno et al. | 362/268 |
| 4,712,910 | 12/1987 | Sakato | 355/53 |
| 4,970,546 | 11/1990 | Suzuki et al. | 355/53 |
| 5,898,477 | 4/1999 | Yoshimura et al. | 355/53 |
| 5,949,468 | 9/1999 | Asahina et al. | 347/246 |

*Primary Examiner*—Mohammad Y. Sikder
*Attorney, Agent, or Firm*—Oliff & Berridge, PLC

[57]                ABSTRACT

An illumination optical apparatus (8) includes a light source (10) and light conducting system (L) that conducts a light beam (14) from the light source to an object (M) such as a mask having a pattern, to be irradiated. A light-attenuating member (18) or other light-intensity controlling member, such as filter, for controlling the intensity of the light beam is arranged in the optical path between the light source and light conducting system. Also disclosed is a method for manufacturing semiconductor devices using the abovementioned illumination optical apparatus. The method includes the steps of determining a photosensitivity of the photosensitive substrate (W), selecting at least one light-attenuating member based on the photosensitivity, inserting the at least one light-attenuating member between the light source and the light conducting system, generating a light beam from the light source and directing the light beam along an axis (A) through the at least one light attenuating member to the light conducting system, illuminating, with the light beam emanating from the light conducting system, a mask having a pattern, and projecting the pattern through a projection optical system (PL) and exposing the photosensitive substrate.

31 Claims, 4 Drawing Sheets

ILLUMINATION OPTICAL APPARATUS AND SEMICONDUCTOR DEVICE MANUFACTURING METHOD

FIELD OF THE INVENTION

The present invention relates to an illumination optical apparatus suitable for use with an illumination optical system of an exposure apparatus for manufacturing semiconductor devices, and to a semiconductor device manufacturing method.

BACKGROUND OF THE INVENTION

In exposure apparatus used in the manufacture of semiconductor devices, a photolithography process is used wherein a circuit pattern formed on an object, like a reticle or mask (generically referred to hereinafter as a "mask") is illuminated by an illumination optical system. An image of this pattern is formed and transferred by a projection optical system (i.e., a projection lens) onto a photosensitive substrate like a glass plate or wafer (generically referred to hereinafter as a "wafer") coated with a photosensitive agent like photoresist. However, it is necessary to set the intensity of the light beam from a light source provided in the illumination optical system to achieve a proper exposure level (defined as the light intensity multiplied by the time of exposure), based on the photosensitivity of the photoresist on the wafer. One method of controlling the intensity of light beam from the light source is by arranging an intensity controlling means, such as a light-attenuating member (e.g., a filter) in the optical path of the illumination optical system.

In conventional illumination optical systems, a light intensity controlling system, such as a light-attenuating filter, is arranged in the optical path removed from the light source. In this case, the light beam from the light source will directly impinge upon one or more optical elements arranged between the light source and the filter without being attenuated. Moreover, in conventional illumination optical systems, a large number of high-intensity light beams irradiate the one or more optical elements (e.g., lenses) on the light-source-side of the filter.

Unfortunately, conventional illumination optical systems as described above are not suitable for certain present-day applications. For example, in semiconductor manufacturing using deep ultraviolet (DUV) light, the optical elements (e.g., lenses) have the characteristic that their light transmittance changes with the amount of electromagnetic waves (e.g., light waves) to which the lens is exposed. The degree of change in transmittance depends on the composition of the lens and the wavelength and intensity of the electromagnetic waves. The greater the intensity of the electromagnetic waves, or the greater the amount of irradiation, the more the light transmittance of the lens changes. Also, depending on the composition of the lens, irradiation by electromagnetic waves causes a chemical reaction, wherein various ions, such as $Na^+$, diffuse out of the lens surface. This results in so-called fogging that irregularly reflects light impinging on the lens. This, in turn, results in markedly deteriorated lens performance and a decline in lens durability.

SUMMARY OF THE INVENTION

The present invention relates to an illumination optical apparatus suitable for use with an illumination optical system of an exposure apparatus for manufacturing semiconductor devices, and to a semiconductor device manufacturing method.

Accordingly, it is an object of the present invention to provide an illumination optical apparatus that can control the intensity of light from a light source in an illumination optical system to an appropriate value. Moreover, it is an object of the present invention to prevent a decrease in the performance of the optical elements (e.g., lenses) in the illumination optical system, as well as improve their durability. It is a further object of the present invention to provide an improved method of manufacturing semiconductor devices using the illumination optical apparatus of the present invention.

A first aspect of the invention is an apparatus for controlling the illumination of an object. The apparatus comprises, along an optical axis, a light source for generating a light beam having an intensity, a light conducting system for conducting the light beam to the object, and a light intensity controlling system, arranged between the light source and the light conducting system, for controlling the intensity of the light beam. The light conducting system preferably includes an optical integrator designed so as to receive the light beam and form a plurality of secondary light sources, and a condenser optical system designed so as to concentrate the light beam from the optical integrator and illuminate the object.

A second aspect of the invention is an apparatus for controlling the illumination of an object. The apparatus comprises, in order along an optical axis, a light source for generating a light beam to travel along the optical axis, the light beam having an intensity, at least one light-attenuating member for attenuating the light beam intensity, a beam-shaping optical system for shaping the light beam, an optical integrator designed so as to form a plurality of secondary light sources from the light beam, and a condenser lens system for condensing light onto the object.

In a third aspect of the invention, the at least one light-attenuating member in the apparatus described above comprises at least one light-attenuating filter arranged on a turret and having a surface normal. The turret is rotatable about a rotation axis oriented substantially parallel to the optical axis such that the at least one light-attenuating filter can be inserted along the optical axis. Preferably, the turret is designed such that at the least one light-attenuating filter is capable of being disposed along the optical axis so that the filter surface normal forms an angle with respect to the optical axis.

A fourth aspect of the invention is a method of manufacturing a semiconductor device by exposing a photosensitive substrate. The method comprises the steps of determining a photosensitivity of the photosensitive substrate, selecting at least one light-attenuating member based on the photosensitivity, inserting the at least one light-attenuating member between the light source and the light conducting system, generating a light beam from the light source and directing the light beam along an axis through the at least one light attenuating member to the light conducting system, illuminating, with the light beam emanating from the light conducting system, a mask having a pattern, and projecting the pattern through a projection optical system and exposing the photosensitive substrate.

DETAILED DESCRIPTION OF THE INVENTION

Figure 1:
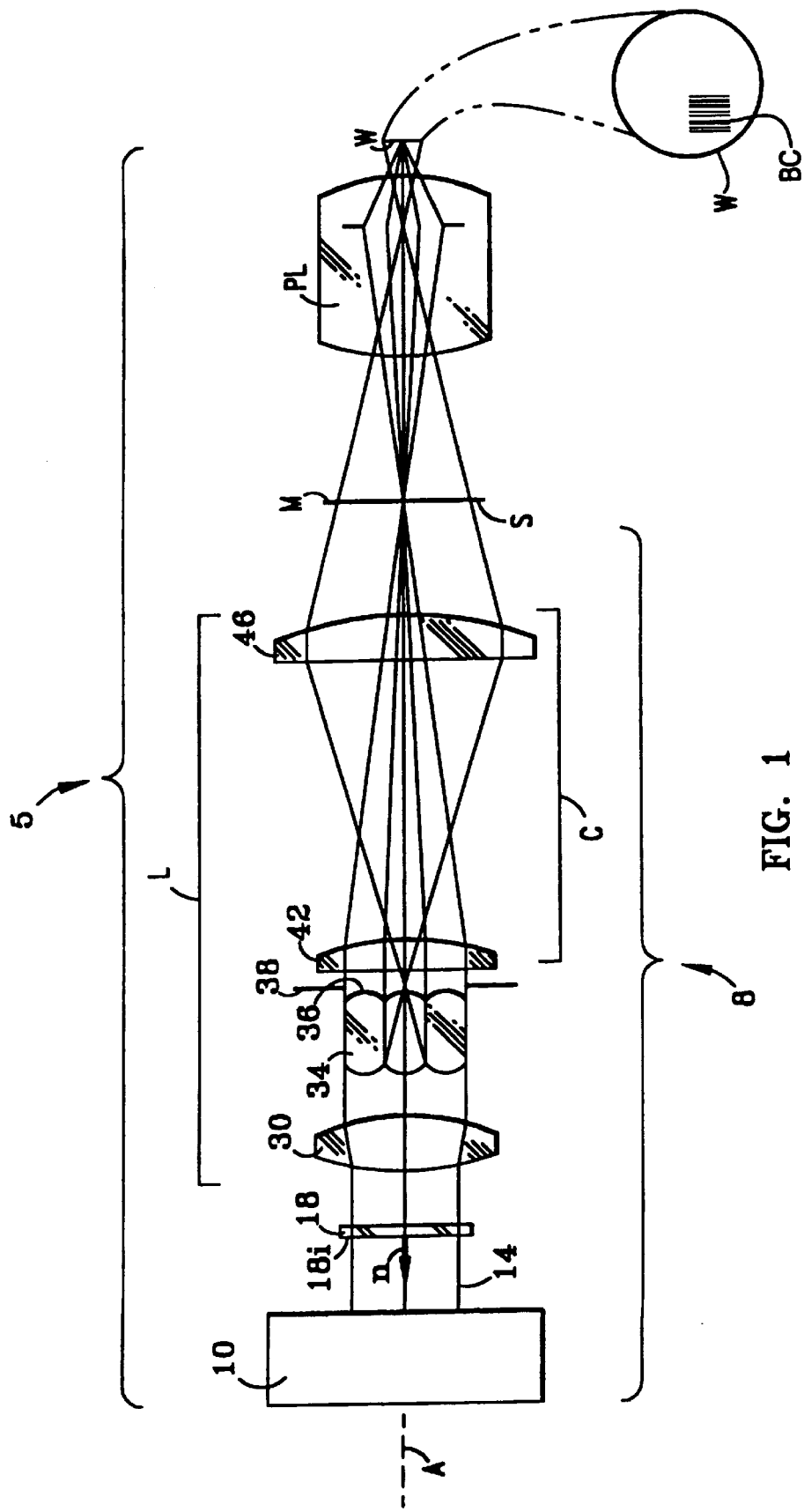
FIG. 1 is a simplified schematic cross-sectional view of an apparatus which includes an illumination optical apparatus according to a first embodiment of the present invention.

The present invention relates to an illumination optical apparatus suitable for use with an illumination optical system of an exposure apparatus for manufacturing semiconductor devices, and to a semiconductor device manufacturing method.

A first embodiment of the illumination optical apparatus of the present invention is now described with reference to FIG. 1 and exposure apparatus 5, which may be used, for example, for manufacturing semiconductor devices. Exposure apparatus 5 includes an illumination optical apparatus 8 and a projection lens PL. A mask M with a surface S facing light source 10 is disposed between illumination optical apparatus 8 and projection lens PL. A wafer W is disposed adjacent projection lens PL on the side opposite mask M, and is conjugate thereto.

Optical illumination apparatus 8 comprises, in order along optical axis A, a light source 10 emitting a light beam 14, a light-attenuating member 18, such as a light-attenuating filter, having an incident side 18$i$ with a surface normal n (which is oriented parallel to the optical axis in the present embodiment), and a light conducting system L. The latter comprises a shaping optical system 30 (e.g., a beam expander), an optical integrator 34 having an exit surface 36, a stop 38, and lenses 42 and 46. Lenses 42 and 46 comprise a condenser lens system C.

With continued reference to FIG. 1, light beam 14 from light source 10 impinges on light-attenuating member 18, which reduces the intensity of light passing therethrough. After passing through light-attenuating member 18, light beam 14 impinges on light conducting system L, which guides the light beam to mask M and, in combination with projection lens PL, exposes wafer W.

More specifically, with continuing reference to FIG. 1, light beam 14, after passing through light-attenuation filter 18, first impinges on optical system 30, which gives the light beam a desired shape. Light beam 14, after being shaped by optical system 30, impinges on optical integrator 34, which forms a plurality of secondary light sources in the vicinity of exit surface 36. Stop 38 is arranged in the vicinity of exit surface 36. After passing through stop 38, light beam 14 is concentrated onto surface S of mask M by condenser lens system C, and made to evenly illuminate the mask surface. Then, the pattern formed on mask surface S is reduced and projected onto wafer W through projection lens PL. As a result, the pattern on mask M is transferred (exposed) onto wafer W as the photosensitive substrate.

After wafer W is exposed as described above, wafer processing is completed by passing the exposed wafer through a variety of processes, such as the development process, followed by the etching process. The development process develops the exposed photoresist, leaving a photoresist pattern on wafer W corresponding to the pattern on mask M. The etching process then precisely etches the region outside the developed photoresist to a desired thickness. Wafer W is then passed through a photoresist elimination process that eliminates unneeded photoresist present on the wafer after the etching process. When the above processes are completed, semiconductor devices (e.g., LSIs and the like) as semiconductor apparatuses are finally manufactured by passing the wafer through various additional processes, such as "dicing," wherein the wafer is cut up into individual chips containing the printed circuitry, "bonding," wherein wiring and the like is assigned and wired to the leads on each chip, and "packaging," wherein each chip is encased in a housing. Although the above describes a case wherein semiconductor devices are manufactured by a photolithography process in a wafer process that uses an exposure apparatus, liquid crystal display devices, thin film magnetic heads and image pickup devices (CCDs and the like) can also be manufactured in like fashion.

When exposing wafer W, it is necessary to use a light exposure level corresponding to the sensitivity of the photoresist coated on wafer W. Consequently, in the present embodiment, light-attenuating member 18 having an optimal light transmittance is selected and inserted between light source 10 and optical system 30 to control the intensity of light beam 14 to correspond to the sensitivity of the photoresist. As a result, an appropriate light exposure level corresponding to the sensitivity of the photoresist can be obtained. Since light-attenuating member 18 is arranged on the light source 10 side of optical system 30, a single light beam 14, rather than a large number of light beams, irradiates optical system 30. Consequently, the fluctuation in the light transmittance of one or more lenses and the fogging of lens surfaces, as discussed above, can be controlled and kept to a minimum, and lens performance and durability can be improved.

Figure 2:
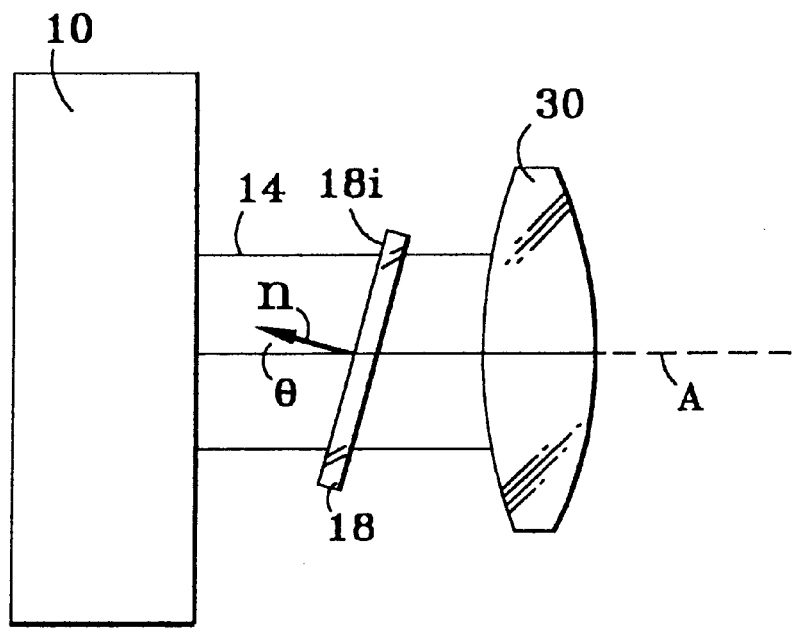
FIG. 2 is a simplified cross-sectional view of an important part of the illumination optical apparatus shown in FIG. 1 according to a second embodiment of the present invention.

With reference now to FIG. 2, in a second embodiment of the present invention, light-attenuating member 18 of the first embodiment, as described above in connection with apparatus 8 of FIG. 1, is arranged so that incident side 18$i$ is inclined at a predetermined inclination angle $\theta$ with respect to optical axis A and surface normal n. In this arrangement, light reflected from light-attenuating member 18 is deflected away from optical axis A and not directly back towards light source 10. Since light reflected back toward light source 10 tends to decrease light source performance, the arrangement of light-attenuating member 18 according to the second embodiment of the present invention allows the light exposure to be controlled and stabilized.

With continuing reference to FIG. 2, in the second embodiment of the present invention, a preferred range for angle $\theta$ is between 5° and 15°. If angle $\theta$ is less than 5°, the return of reflected light to light source 10 cannot be completely prevented. Conversely, if angle $\theta$ is greater than 15°, it becomes necessary to increase the configuration space of light-attenuating member 18 (e.g., the axial distance between light source 10 and the filter needs to be increased). Consequently, the constraints on the design of the optical system increase.

Figure 3:
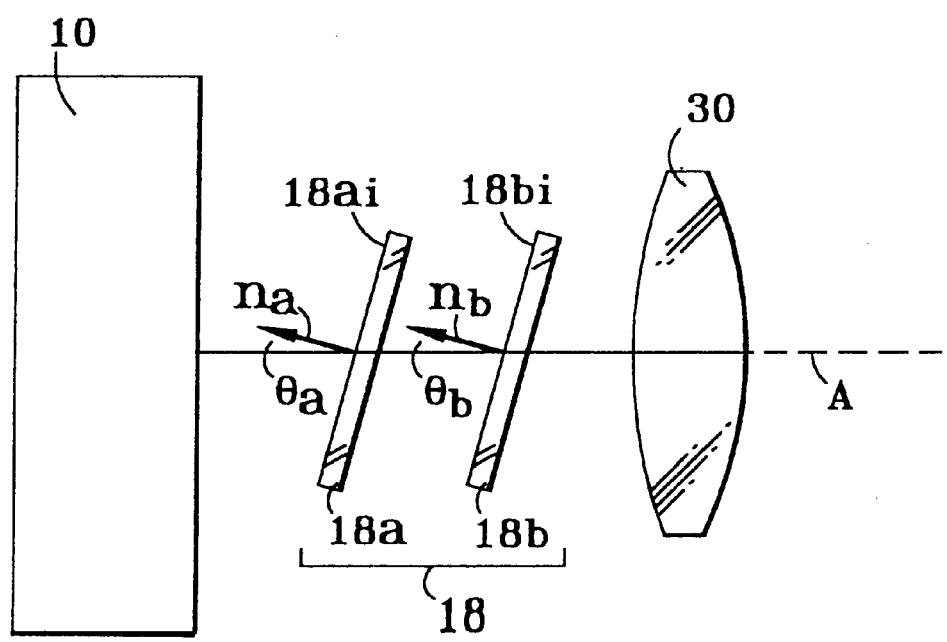
FIG. 3 is a simplified cross-sectional view of an important part of the illumination optical apparatus shown in FIG. 1 according to a third embodiment of the present invention.

With reference now to FIG. 3, in a third embodiment of the present invention, light-attenuating member 18 comprises a first light-attenuating member 18$a$ and second light-attenuating member 18$b$ having incident surfaces 18$ai$ and 18$bi$, respectively, with surface normals $n_a$ and $n_b$, respectively. First and second light-attenuating members 18$a$ and 18$b$ are both arranged so that surface normals $n_a$ and $n_b$ are inclined by angles $\theta_a$ and $\theta_b$, respectively to optical axis A. Preferably, $\theta_a = \theta_b = \theta$. To control the intensity of light beam 14 from light source 10 so that the light beam has an intensity corresponding to the sensitivity of the photoresist, first and second light-attenuating members 18a and 18b are selected from among light-attenuating members having identical or differing light transmittances. Light-attenuating members 18a and 18b are then combined so that they form the optimal light transmittance. In this manner, by selecting and combining a plurality of such members having identical or differing light transmittances, the light intensity, and hence the light exposure level, can be appropriately controlled.

Light-attenuating members for the present invention, such as member 18 of FIG. 2, may be filters fabricated by vapor depositing a plurality of layers of a substance like chrome, aluminum oxide or magnesium fluoride on the light source side of the plane parallel plate (e.g., plate glass). The layers are designed so that the filter has a predetermined transmittance in accordance with the wavelength of the light source. For example, if one or more of the abovementioned substances is vapor deposited on a plane parallel plate thereby forming a light-attenuating member (filter) 18 having a transmittance of 10%, then the intensity of light passing through the filter is attenuated by 90%. In addition, since two filters may be arranged to control the intensity of light (e.g., serve as light intensity controlling means or a light intensity control system), such as described above in connection with the third embodiment of the present invention, the effect of light attenuation when setting a predetermined transmittance can be multiplied.

Figure 4:
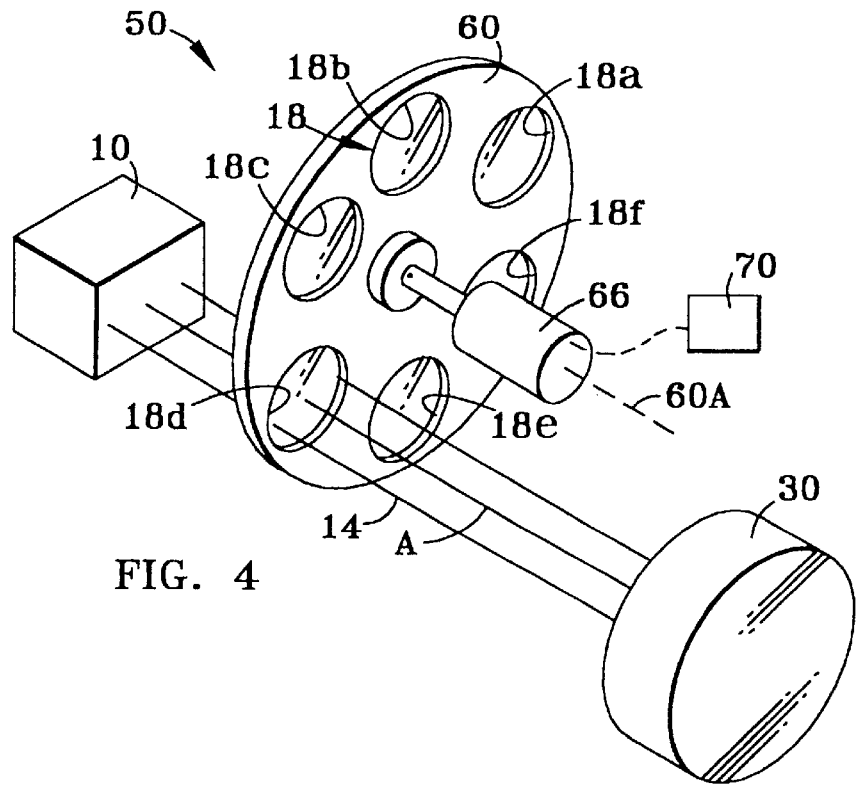
FIG. 4 is a perspective view of the turret of an illumination optical apparatus according to a fourth embodiment of the present invention.

With reference now to FIG. 4, a fourth embodiment of an illumination optical apparatus 50 of the present invention includes a light-attenuating member in the form of a turret 60 arranged in the optical path between light source 10 and optical system 30. Turret 60 includes six light-attenuating sub-members (e.g., filters) 18a–18f having differing light transmittances. Light-attenuating sub-members 18a–18f are arranged at nearly equal angular spacings on turret 60. The latter also includes a rotational axis 60A arranged parallel to optical axis A. Turret 60 is constructed so that it can be rotated around rotational axis 60A by a drive motor 66. Motor 66 is connected to a control apparatus 70, which is used to control the rotation of turret 60 and hence the placement of light-attenuating sub-members 18a–18f in the optical path (i.e., into light beam 14).

With continuing reference to FIG. 4, light-attenuating sub-members 18a–18f arranged at nearly equal angular spacings and preferably turret 60 further includes a rotational axis 60A arranged parallel to optical axis A. Turret 60 is constructed so that it can be rotated around rotational axis 60A by a drive motor 66. Motor 66 is connected to a control apparatus 70, which is used to control the rotation of turret 60 via motor 66 and hence the placement of light-attenuating sub-members 18a–18f in the optical path.

Figure 5:
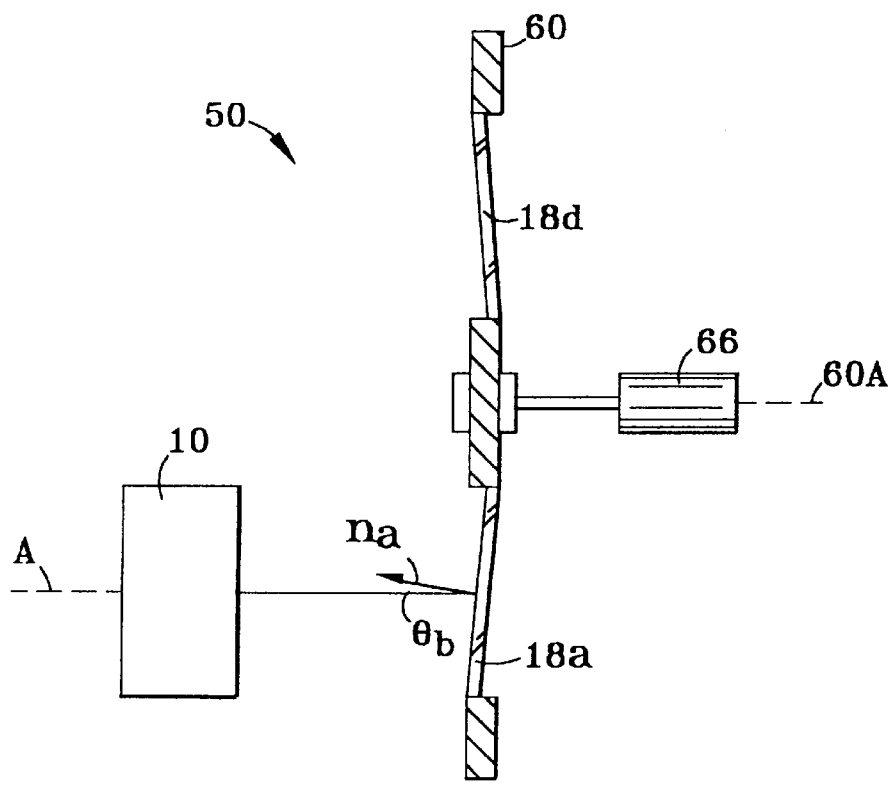
FIG. 5 is a cross-sectional view of a preferred turret as shown in FIG. 4.

With reference now to FIG. 5, light-attenuating sub-members 18a–18f (only 18a and 18d are visible in cross-section) are preferably mounted on turret 60 at an angle $\theta$. Thus, when each of sub-members 18a–18f is placed in the optical path (i.e., placed along optical axis A), surface normal n associated with each sub-member surface is inclined at angle $\theta$ with respect to optical axis A.

Thus, the fourth embodiment of the present invention allows the light exposure level to be appropriately controlled by selecting a light-attenuating member having a light transmittance corresponding to the sensitivity of the photoresist on wafer W. The particular sub-member is chosen from among the six light-attenuating sub-members 18a–18f arranged on turret 60, and the turret is rotated to place the filter along optical axis A. The number of light-attenuating sub-members 18 arranged on turret 60 can be suitably selected in accordance with the variation in the sensitivity of the photoresist used. In addition, turret 60 itself may be inclined at angle $\theta$ relative to optical axis A, rather than inclining each light-attenuating member by angle $\theta$.

Figure 6:
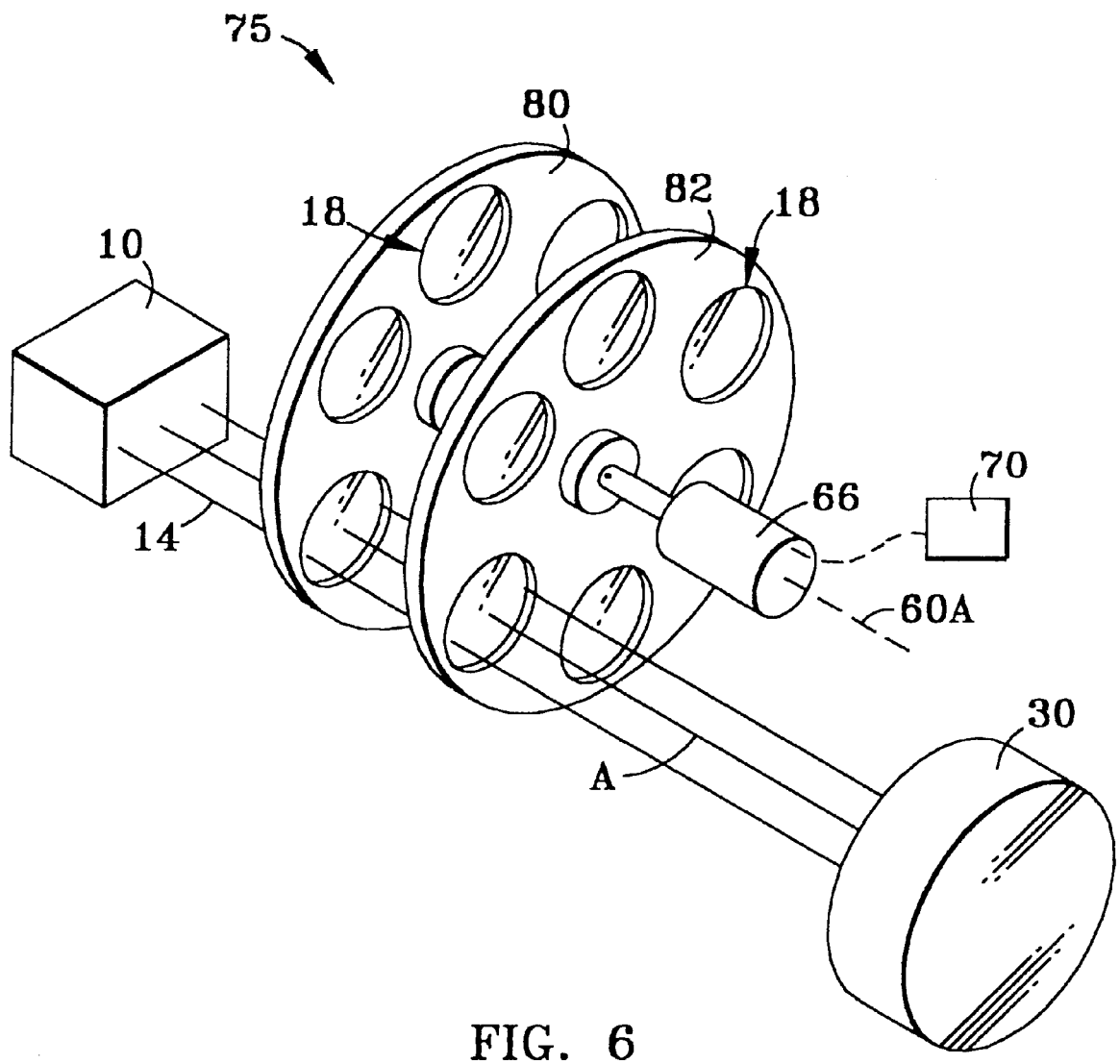
FIG. 6 is a perspective view of the turrets of the illumination optical apparatus according to a fifth embodiment of the present invention.

With reference now to FIG. 6, a fifth embodiment of an illumination optical apparatus 75 of the present invention is now described. Apparatus 75 is similar to apparatus 50 except that apparatus 75 includes a first turret 80 and second turret 82 arranged in the optical path between light source 10 and optical system 30. First and second turrets 80 and 82 are preferably configured the same as turret 60 of apparatus 50, described above. By selecting the appropriate light-attenuating sub-members 18 from among the respective sub-members on each of first and second turrets 80 and 82 (six such sub-members are shown), and by combining sub-members on the first and second turret, the desired light transmittance can be achieved. Since a large number of light transmittance combinations are possible from a only a few types of light-attenuating sub-members with the configuration of apparatus 75, the light transmittance can be finely set to correspond to the sensitivity of the photoresist.

As mentioned above, each light-attenuating sub-member 18 provided in turrets 60, 80 and 82 in apparatus 50 (FIG. 4) and apparatus 75 (FIG. 6), respectively, is preferably a filter fabricated by vapor depositing of a plurality of layers of a substance like chrome, aluminum oxide or magnesium fluoride onto a circular plane parallel plate (plate glass). The layers are designed so that they form a filter having a respective predetermined transmittance in accordance with the wavelength of the light source.

In addition, as a sixth embodiment of the present invention, a configuration is also possible wherein the optimal light-attenuating sub-member is automatically selected based on information pertaining to the sensitivity of the photoresist on wafer W. For example, in illumination optical apparatus 50 of FIG. 4, sensitivity information pertaining to the photoresist may be displayed in advance by a barcode BC on the surface of wafer W. The barcode is read by a bar code reading apparatus (i.e., a barcode reader) and is transmitted to control apparatus 70. Then, based on this information, control apparatus 70 controls motor 66 which, in turn, drives turret 60 so that the light-attenuating sub-member 18 having the optimum transmittance is automatically selected from among light-attenuating sub-members arranged on turret 60. As a result, the optimal transmittance can be speedily selected. It will be apparent to one skilled in the art that this sixth embodiment of the present invention pertaining to an automatic sub-member (filter) selection configuration can also be applied in like fashion to illumination optical apparatus 75 of FIG. 6.

It will also be apparent to one skilled in the art that the illumination optical apparatus of the present invention is also applicable to an exposure apparatus of the static exposure (i.e., a stepper) type or the scanning exposure (i.e., step and scan) type.

According to the illumination optical apparatus of the present invention as described above, the intensity of light in an exposure apparatus can be appropriately controlled. Moreover, a light intensity controlling system, such as one or more light-attenuating members, is disposed between, for example, the light source and the beam-shaping optical system. This prevents a large number of high-intensity light beams from passing through the illumination optical apparatus and the illumination optical system. This results in a high-performance, durable illumination optical apparatus that prevents fluctuation in the light transmittance of lenses comprising the optical system and prevents fogging of the lens surfaces. In addition, by using the illumination optical apparatus of the present invention, semiconductor devices can be more easily manufactured.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. An apparatus for controlling the illumination of an object, comprising, along an optical axis:
    a light source that generates a light beam having an intensity;
    a light conducting system, disposed between the light source and the object, that conducts said light beam to the object; and
    a light intensity controlling system, arranged between said light source and said light conducting system, that controls said intensity of said light beam, said light intensity controlling system including an adjusting unit disposed at an optical path of said light beam and inclined at a predetermined inclination angle with respect to the optical axis.

2. An apparatus according to claim 1, wherein said light conducting system includes:
    a) an optical integrator designed so as to receive said light beam and form a plurality of secondary light sources; and
    b) a condenser optical system designed to concentrate said light beam from said optical integrator and illuminate the object.

3. An apparatus according to claim 2, wherein said light conducting system includes a beam-shaping optical system that shapes said light beam and further is arranged between said light intensity controlling system and said optical integrator.

4. An apparatus according to claim 1, wherein:
    said adjusting unit includes a light-attenuating member having a first side upon which said light beam is incident, said light-attenuating member designed so as to attenuate said intensity of said light beam; and
    said light-attenuating member is arranged so that said first side is inclined at a predetermined inclination angle with respect to the optical axis.

5. An apparatus according to claim 4, wherein said angle is in the range between 5° and 15°.

6. An apparatus according to claim 1, wherein said adjusting unit includes a plurality of light-attenuating members arranged along the optical axis.

7. An apparatus according to claim 6, wherein each light-attenuating member in said plurality of light-attenuating members includes a first side inclined at an inclination angle with respect to the optical axis.

8. An apparatus according to claim 1, wherein said light intensity controlling system comprises at least one light-attenuating filter arranged on a turret and having a surface normal, said turret being rotatable about a rotation axis oriented substantially parallel to the optical axis such that said at least one light-attenuating filter can be inserted along the optical axis.

9. An apparatus according to claim 8, wherein said turret is designed such that said at least one light-attenuating filter is capable of being disposed along the optical axis so that said surface normal forms an angle with respect to said optical axis.

10. An apparatus according to claim 9, wherein said angle is between 5° and 15°.

11. An apparatus according to claim 1, wherein said predetermined inclination angle is between 5° and 15°.

12. A method for producing a semiconductor device by utilizing the apparatus according to claim 11, comprising the steps of:
    illuminating a mask prepared as the object with said light beam from said light conducting system; and
    exposing a pattern formed on the mask onto a photosensitive substrate.

13. A method for producing a semiconductor device by utilizing the apparatus according to claim 1, comprising the steps of:
    illuminating a mask prepared as the object with said light beam from said light conducting system; and
    exposing a pattern formed on the mask onto a photosensitive substrate.

14. An apparatus for controlling the illumination of an object, comprising, along an optical axis:
    a light source that generates a light beam having an intensity;
    at least one light-attenuating member that attenuates said light beam intensity, said at least one light-attenuating member disposed in an optical path of said light beam and inclined at a predetermined inclination angle with respect to the optical axis;
    a beam-shaping optical system that shapes said light beam;
    an optical integrator disposed between said light source and said object; and
    a condenser system disposed between said optical integrator and the object so as to concentrate light onto the object.

15. An apparatus according to claim 14, wherein said at least one light-attenuating member is a light-attenuating filter.

16. An apparatus according to claim 14, wherein said at least one light-attenuating member comprises at least one light-attenuating filter arranged on a turret and having a surface normal, said turret being rotatable about a rotation axis oriented substantially parallel to the optical axis such that said at least one light-attenuating filter can be inserted along the optical axis.

17. An apparatus according to claim 4, further comprising:
    a motor connected to said turret to rotate said turret about said rotation axis; and
    a control system that controls said motor.

18. An apparatus according to claim 17, wherein said control system controls said motor as a function of information contained in a bar code on the object.

19. An apparatus according to claim 14, wherein said turret is designed such that said at least one light-attenuating filter is capable of being disposed along the optical axis so that said surface normal forms an angle with respect to said optical axis.

20. An apparatus according to claim 19, wherein said angle is between 5° and 15°.

21. An apparatus according to claim 14, wherein said predetermined inclination angle is between 5° and 15°.

22. A method for producing a semiconductor device by utilizing the exposure apparatus according to claim 21, comprising the steps of:

illuminating a mask prepared as the object with said light beam from said light conducting system; and exposing a pattern formed on the mask onto a photosensitive substrate.

23. A method for producing a semiconductor device by utilizing the apparatus according to claim 14, comprising the steps of:

illuminating a mask prepared as the object with said light beam from said light conducting system; and exposing a pattern formed on the mask onto a photosensitive substrate.

24. An exposure apparatus for exposing a photosensitive substrate, comprising, along an optical axis:

a light source that generates a light beam having an intensity;

at least one light-attenuating member that attenuates said light beam intensity, said at least one light-attenuating member disposed in an optical path of said light beam and inclined at a predetermined inclination angle with respect to the optical axis;

a beam-shaping optical system that shapes said light beam;

an optical integrator disposed between said light source and a mask;

a condenser system disposed between said optical integrator and the mask to direct light onto the mask; and a projection optical system disposed between the mask and the photosensitive substrate so as to project an image of the mask onto the photosensitive substrate.

25. An exposure apparatus according to claim 24, wherein said at least one light-attenuating member is a light-attenuating filter.

26. An exposure apparatus according to claim 25, wherein said predetermined inclination angle is between 5° and 15°.

27. An exposure apparatus according to claim 24, wherein said at least one light-attenuating member is a rotatable turret with at least one light-attenuating filter.

28. An exposure apparatus according to claim 27, wherein said predetermined inclination angle is between 5° and 15°.

29. An exposure apparatus according to claim 24, wherein said predetermined inclination angle is between 5° and 15°.

30. A method for producing a semiconductor device by utilizing the exposure apparatus according to claim 29, comprising the steps of:

illuminating the mask with said light beam from said condenser system; and exposing the image of the mask onto the photosensitive substrate by using said projection optical system.

31. A method for producing a semiconductor device by utilizing the exposure apparatus according to claim 24, comprising the steps of:

illuminating the mask with said light beam from said condenser system; and exposing the image of the mask onto the photosensitive substrate by using said projection optical system.

* * * * *